(12) United States Patent
Lo

(10) Patent No.: US 8,470,657 B1
(45) Date of Patent: Jun. 25, 2013

(54) ION IMPLANTATION METHOD FOR SEMICONDUCTOR SIDEWALLS

(75) Inventor: Chih-Hsin Lo, Taichung (TW)

(73) Assignee: Rexchip Electronics Corporation, Taichung (TW)

( * ) Notice: Subject to any disclaimer, the term of this patent is extended or adjusted under 35 U.S.C. 154(b) by 0 days.

(21) Appl. No.: 13/532,293

(22) Filed: Jun. 25, 2012

(51) Int. Cl.
*H01L 21/8238* (2006.01)
*H01L 21/425* (2006.01)
*H01L 21/22* (2006.01)
*H01L 21/38* (2006.01)

(52) U.S. Cl.
USPC .... 438/206; 438/524; 438/561; 257/E29.336; 257/E33.046

(58) Field of Classification Search
USPC .......... 438/206, 524, 561; 257/E29.336, 257/E33.046
See application file for complete search history.

(56) References Cited

U.S. PATENT DOCUMENTS

| 7,554,148 | B2 | 6/2009 | Su et al. | |
| 2004/0021062 | A1* | 2/2004 | Zaidi | 250/214 R |
| 2008/0246122 | A1* | 10/2008 | Wilson et al. | 257/622 |

* cited by examiner

*Primary Examiner* — David S Blum
(74) *Attorney, Agent, or Firm* — Muncy, Geissler, Olds & Lowe, PLLC

(57) ABSTRACT

An ion implantation method for semiconductor sidewalls includes steps of: forming a trench on a substrate, and the trench having a lower reflecting layer and two sidewalls adjacent to a bottom section; performing a plasma doping procedure to sputter conductive ions to the lower reflecting layer and the conductive ions being rebounded from the lower reflecting layer to adhere to the sidewalls to respectively form an adhesion layer thereon; and performing an annealing procedure to diffuse the conductive ions of the adhesion layer into the substrate to form a conductive segment. Thus, without damaging the substrate, the conductive segment having a high conductive ion doping concentration is formed at a predetermined region to satisfy semiconductor design requirements.

15 Claims, 8 Drawing Sheets

ION IMPLANTATION METHOD FOR SEMICONDUCTOR SIDEWALLS

FIELD OF THE INVENTION

The present invention relates to an ion implantation method, and particularly to an ion implantation method for semiconductor sidewalls.

BACKGROUND OF THE INVENTION

As semiconductor manufacturing techniques continuously progress, not only the size but also the manufacturing costs of electronic components are reduced. Common semiconductor manufacturing techniques in the recent years are limited to form a planar semiconductor structure through etching, ion implantation, distribution and wiring on a substrate to achieve a chip size as small as 6F2. However, since the speed of miniaturization of feature size has gradually become slow, the techniques above no longer render a noticeable area reduction for a semiconductor component on a wafer. Hence, a vertical semiconductor (or referred to as a three-dimensional semiconductor) manufacturing technique is then developed. In the vertical semiconductor manufacturing technique, a semiconductor is vertically grown on a wafer to reduce the area occupied by transistors on the wafer surface, thereby further reducing the chip size to 4F2.

The vertical transistors are generally manufactured through a stack approach or a trench approach. In the trench approach for forming a vertical transistor, a substrate is excavated downwards to form a plurality of trenches and a plurality of posts each being disposed between any two of the trenches. By performing ion implantation, ion diffusion or deposition to the posts as well as performing a semiconductor manufacturing process in the trenches, the vertical transistor is formed. The U.S. Pat. No. 7,554,148 "Pick-up Structure for DRAM Capacitor" discloses a manufacturing process for a DRAM, in which a doped band is formed at a bottom of a trench for electric conduction. To prevent issues of damages, current leakage and high impedance of the substrate, the process of forming the doped band requires characteristics of high stability, high positioning accuracy and high concentration in order to form the high-concentration doped band at a correct position. A conventional method for providing the doped band includes poly doping and ion implant. However, the concentration yielded by poly doping is rather low and difficult to adjust, such that a conductive segment having a low impedance value cannot be formed through ion diffusion. As a result, the method of poly doping renders unsatisfactory feasibility. Referring to FIG. 1, the ion implant is capable of accurately controlling the doping concentration, and is also capable of injecting ions to sidewalls 2 or a bottom surface 3 of a trench 1 to form a low-impedance conductive segment 4 at a predetermined position. With great progress of the semiconductor manufacturing techniques, an aspect ratio of the trench 1 keeps increasing. Since the depth of the trench 1 is much greater than the width of the trench 1, ions need to be injected to the predetermined position at an angle more parallel to the depth of the trench, but this process is quite difficult to practice. Further, not only the position but also the area to which the ions are injected is difficult to control, resulting in a current leakage or a low ion diffusion rate in the trench 1 as setbacks.

Therefore, there is a need for a solution for overcoming issues of the low diffusion rate, the damage of the substrate due to ion injection and the current leakage caused by an incorrect ion implant region, as well as for increasing the doping concentration to lower the impedance.

SUMMARY OF THE INVENTION

Therefore the primary object of the present invention is to overcome the problem of difficult ion implant at a bottom position due to an aspect ratio for a vertical transistor structure.

To achieve the above object, an ion implantation method for semiconductor sidewalls is provided by the present invention. The method comprises the following steps.

In Step S1, at least one trench is formed on a substrate. The trench has an opening, a bottom section far away from the opening, a lower reflecting layer formed on the bottom section, and two sidewalls adjacent to the bottom section.

In Step S2, a plasma doping procedure is performed to sputter conductive ions to the lower reflecting layer, and the conductive ions are rebounded from the lower reflecting layer to adhere to the two sidewalls to respectively form an adhesion layer.

In Step S3, an annealing procedure is performed to diffuse the conductive ions of the adhesion layer into the substrate via the sidewall to form a conductive segment.

Accordingly, in the ion implantation method of the present invention, the adhesion layer is formed through rebounding the conductive ions from the lower reflecting layer to the sidewall, and the conductive ions of the adhesion layer are diffused into the substrate to form the conductive segment having a high conductive ion concentration during the annealing procedure.

The present invention offers several advantages. First of all, due to properties of the plasma, the conductive ions having a high concentration are adhered to the sidewall, so that a conductive segment having a high doping concentration and low impedance is formed. The conductive segment is formed at a fixed position by accurately controlling the position of the adhesion layer through rebounding the conductive ions. The issue of damaging the substrate is also prevented by injecting the ions through rebounding rather than with a large force that may cause the ions to penetrate the sidewalls. Further, the conductive ions are effectively diffused to the substrate to form the conductive segments through the annealing procedure.

The foregoing, as well as additional objects, features and advantages of the invention will be more readily apparent from the following detailed description, which proceeds with reference to the accompanying drawings.

DETAILED DESCRIPTION OF THE PREFERRED EMBODIMENTS

The description below shall be given with reference to FIGS. 2 and 3A to 3F to explain an ion implantation method for semiconductor sidewalls 23 according to one embodiment of the invention. In the embodiment of the invention, a buried bit line of a dynamic random access memory (DRAM) is taken as an example.

Figure 1:
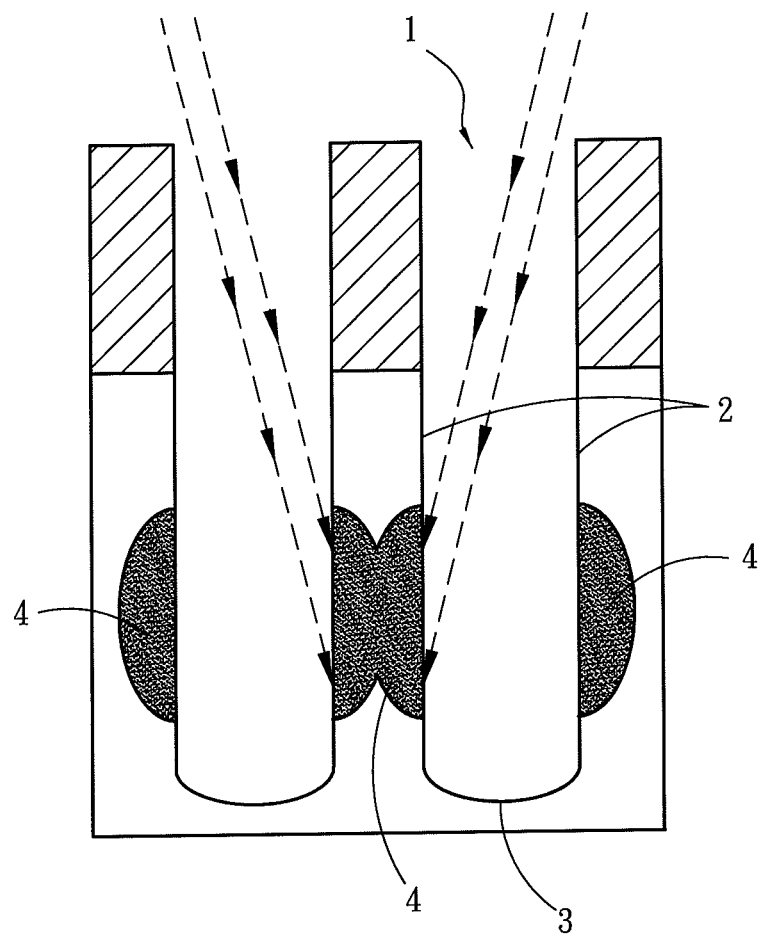
FIG. 1 is a schematic diagram of ion distribution and ion implant in the prior art.
Figure 2:
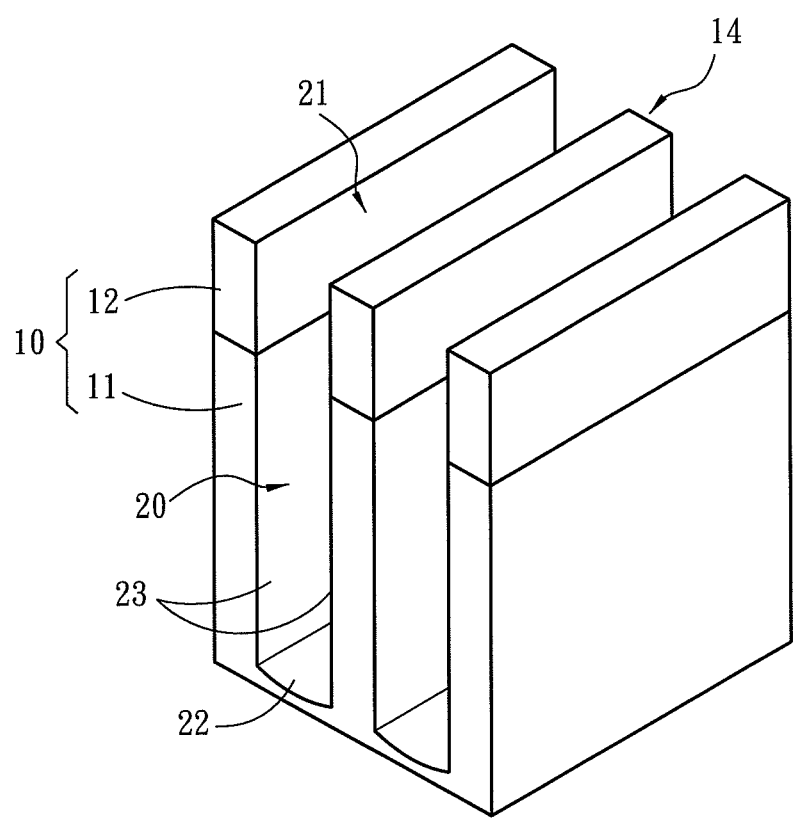
FIG. 2 is a schematic diagram of trenches according to one embodiment of the invention.

In Step S1, at least one trench 20 is formed on a substrate 10. Referring to FIG. 2, the substrate 10 is formed by sequentially depositing a semiconductor layer 11 and an insulating layer 12. In this embodiment, for example, the semiconductor layer 11 can be made of silicon, and the insulating layer 12 can be made of silicon nitride. The trench 20 is formed by photoresist and etching. The trench 20 has an opening 21, a bottom section 22 far away from the opening 21, and two sidewalls 23 adjacent to the bottom section 22. In this embodiment, a plurality of trenches 20 and a plurality of posts 14 each being disposed between any two of the trenches 20 are formed, and the conductive ions are doped in each of the posts 14 to form a bit line. The invention is targeted to solve the foregoing issue of ion doping situation where the aspect ratio of the trench 20 is 10:1, i.e., if the width of the trench 20 is x, the depth of the trench 20 is greater than 10x.

To define a position of the bit line of the DRAM, the method comprises Steps S1A and S1B after Step S1.

Figure 3A:
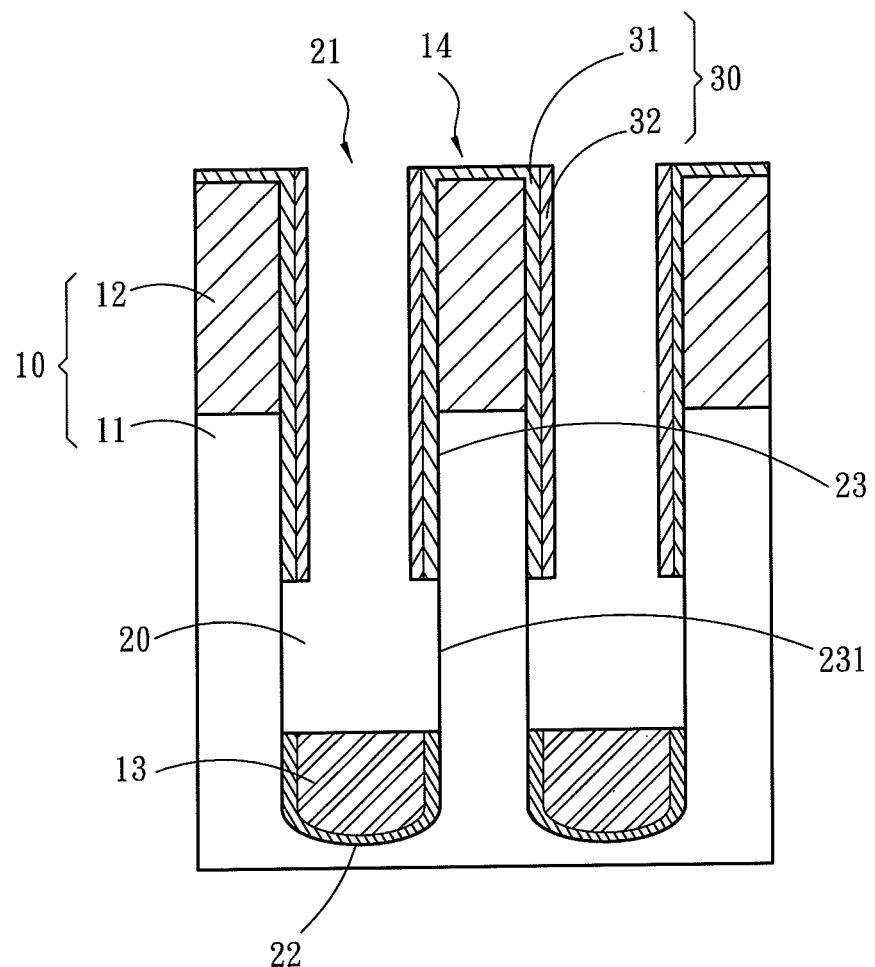
FIGS. 3A to 3F are schematic diagrams of a method according to one embodiment of the invention.

In Step S1A, at least one protection layer 30 is formed on surfaces of the substrate 10 and the trench 20. Referring to FIG. 3A, the protection layer 30 comprises an oxidation protection layer 31 and a silicon nitride protection layer 32 sequentially deposited on the surfaces of substrate 10 and the trench 20. For example, the oxidation protection layer 31 may be made of silicon dioxide.

In Step S1B, a lower reflecting layer 13 is formed at the bottom section 22 of the trench 20. The lower reflecting layer 13 is formed at the bottom section 22 of the trench 20 by a spin-on dielectric (SOD) material. Thus, a doping sidewall 231 is defined between the lower reflecting layer 13 and the protection layer 30.

Figure 3B:
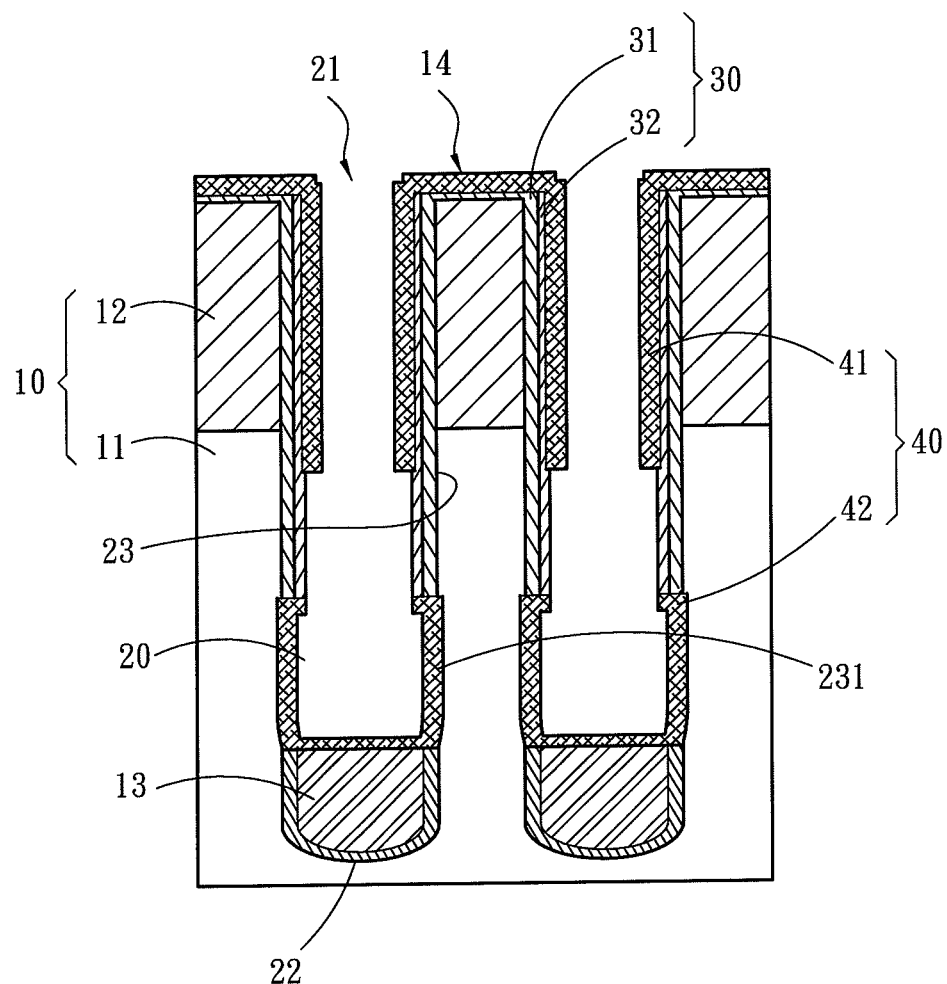

In Step S2, conductive ions rebounding procedure is performed. Referring to FIG. 3B, the conductive ions are adhered to the substrate 10 and the two sidewalls 23 through plasma doping to form respectively an adhesion layer 40. The adhesion layer 40 comprises an upper adhesion layer 41 and a lower adhesion layer 42. More specifically, the conductive ions are an element selected from the 5A element group. In this embodiment of the invention, hydrogen arsenide or hydrogen phosphide is used as an example for meeting actual requirements. The conductive ions are deposited on the surface of the substrate 10, the sidewalls 23 of the trench 20 adjacent to the opening 21, and the surface of the lower reflecting layer 13 to form the upper adhesion layer 41. Further, the deposition of the conductive ions is performed in coordination with an inert gas such as neon, argon and krypton. The inert gas impacts the conductive ions deposited on the lower reflecting layer 13 to allow the conductive ions to be rebounded to adhere to the two doping sidewalls 231 to form the lower adhesion layer 42. Further, due to the impact by the inert gas, the thickness of the lower adhesion layer 42 formed on the lower reflecting layer 13 is thinner than that of the upper adhesion layer 41. The upper adhesion layer 41 is formed by natural deposition, and can no longer be deposited and adhered to the sidewalls 23 once a certain depth is reached. The lower adhesion layer 42 is formed through rebounding the conductive ions to adhere to the doping sidewall 231 adjacent to the lower reflecting layer 13. Hence, the upper adhesion layer 41 and the lower adhesion layer 42 are not necessarily connected to each other.

Hydrogen arsenide used as the conductive ions is extremely volatile. Therefore, to avoid the volatilization and to prevent operating staff from inhaling hydrogen arsenide to be poisoned, the ion implantation method according to one embodiment of the invention further comprises the following steps.

Figure 3C:
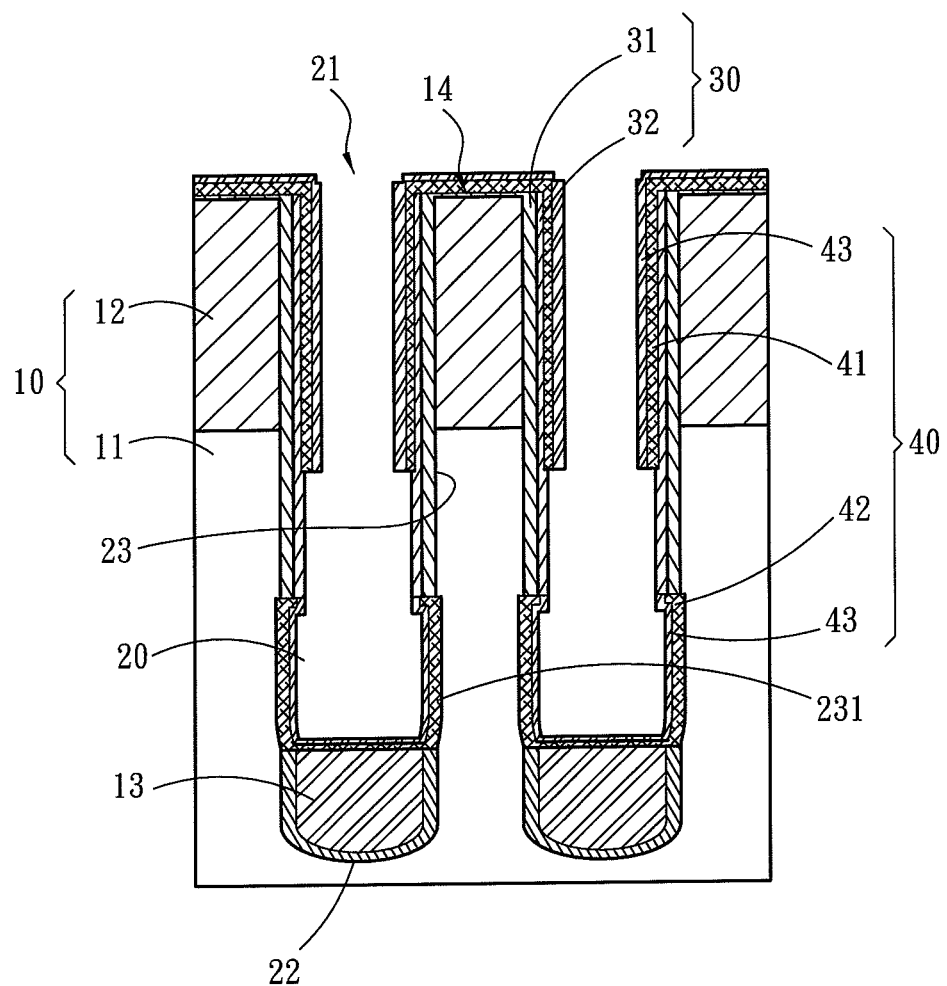

In Step S2A, an oxidation adhesion layer 43 is formed. Referring to FIG. 3C, the surface of the adhesion layer 40 is directly oxidized to form the oxidation adhesion layer 43.

Figure 3D:
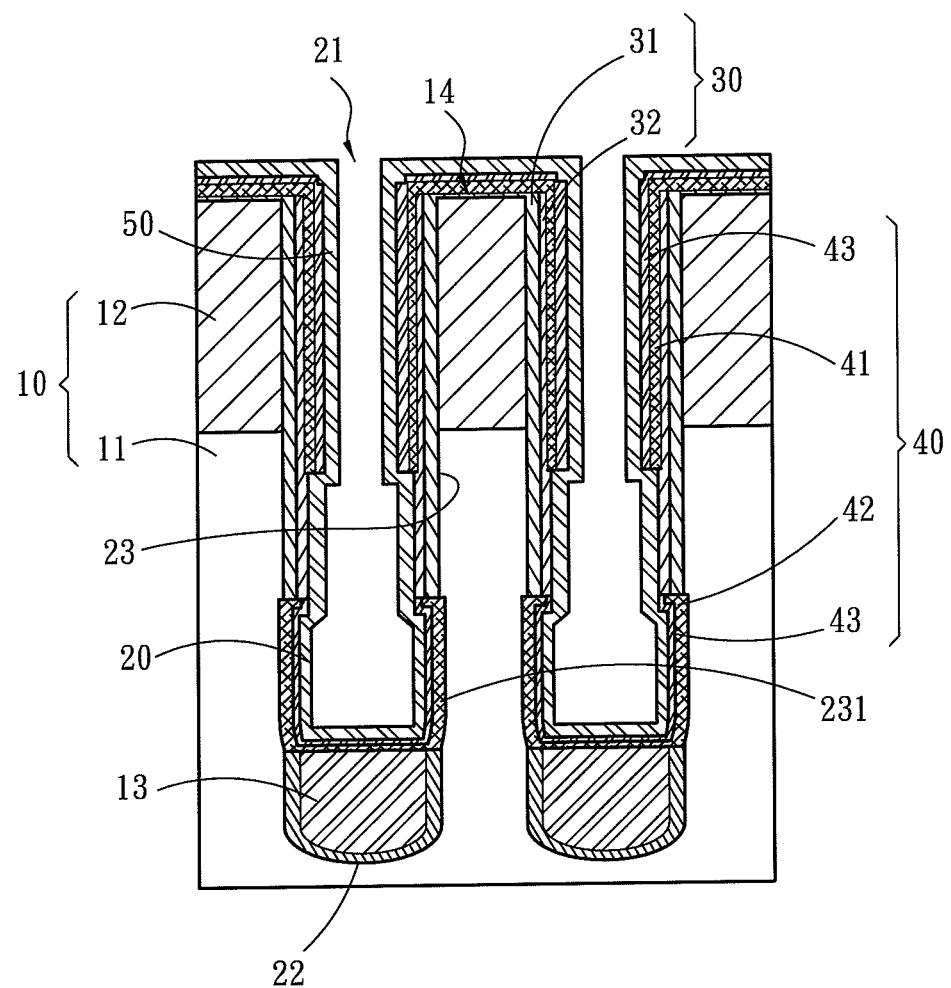

In Step S2B, an oxidation layer 50 is deposited on a surface of the adhesion layer 40. Referring to FIG. 3D, the oxidation layer 50 is directly deposited on the surface of the adhesion layer 40. Alternatively, Step S2A is performed to deposit the oxidation layer 50 on a surface of the oxidation adhesion layer 43. For example, the oxidation layer 50 is formed by atomic layer deposition (ALD) or molecular layer deposition (MLD).

Figure 3E:
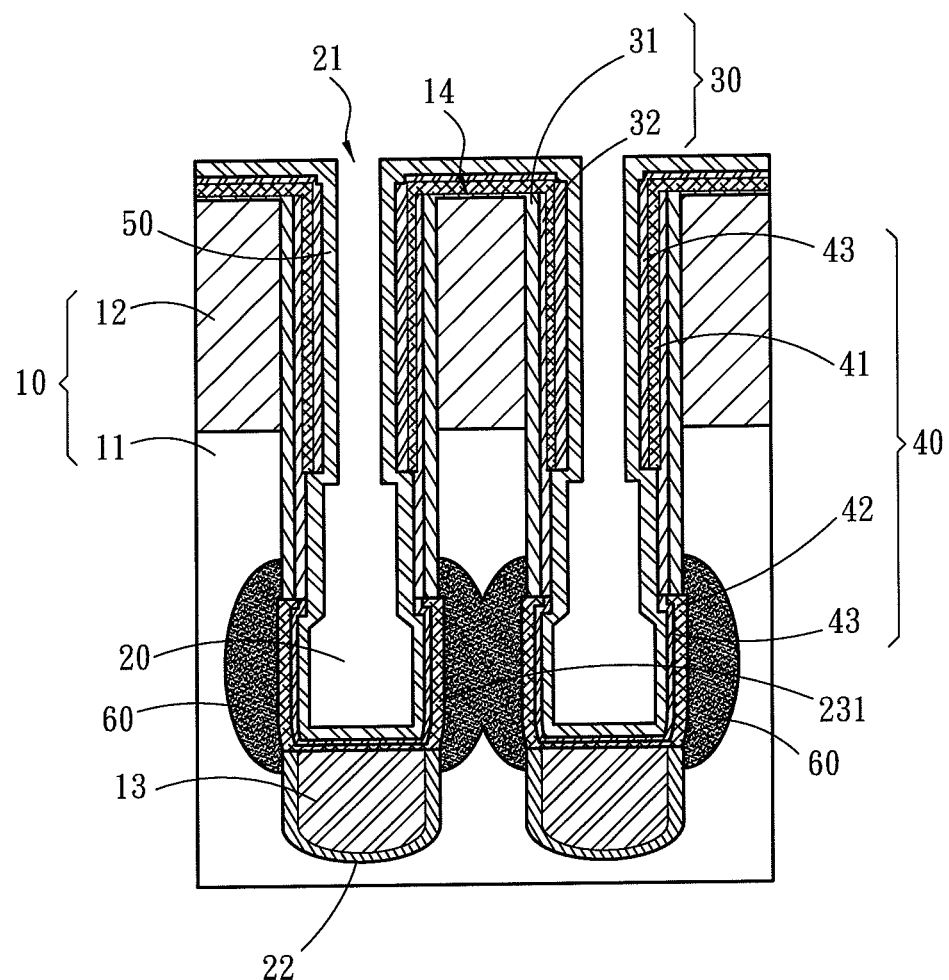

In Step S3, an annealing procedure is performed. Referring to FIG. 3E, the conductive ions of the lower adhesion layer 42 is diffused into the post 14 of the substrate 10 via the sidewall 23 to form a conductive segment 60. It should be noted that since one side of the upper adhesion layer 14 near the post 14 is insulated by the protection layer 30, the conductive ions of the upper adhesion layer 41 are not diffused into the post 14. Further, due to the provision of the oxidation adhesion layer 43 and the oxidation layer 50, the conductive ions of the adhesion layer 40 are not volatilized and so safety during the manufacturing process is ensured.

Figure 3F:
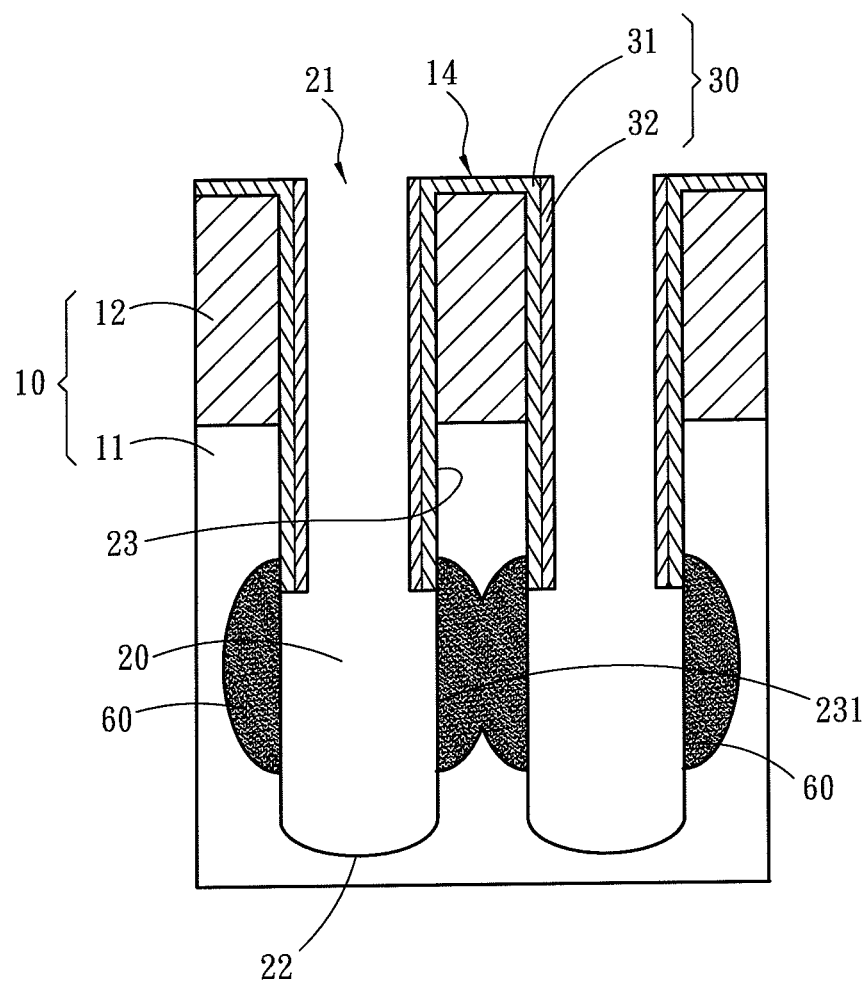

In Step S4, a deoxidation procedure is performed. Referring to FIG. 3F, the oxidation layer 50, the oxidation adhesion layer 43 and the lower reflecting layer 13 made of oxide are removed by wet etching. The manufacturing process is completed after the upper adhesion layer 41 adhered to the sidewalls 23 is removed as well. FIG. 3F clearly depicts the conductive segment 60 serving as a buried bit line.

Accordingly, in the ion implantation method of the present invention, the adhesion layer is formed through rebounding the conductive ions by the plasma, and the conductive ions of the adhesion layer are diffused into the substrate to form the conductive segment having a high conductive ion concentration during the annealing procedure.

The present invention offers several advantages. First of all, due to properties of the plasma, the conductive ions having a high concentration are adhered to the sidewall, so that the conductive segment having a high doping concentration and low impedance is formed. The conductive segment is formed at a fixed position by accurately controlling the position of the adhesion layer through rebounding the conductive ions. The issue of damaging the substrate is also prevented by injecting the ions through rebounding rather than with a large force that may cause the ions to penetrate the sidewalls. Moreover, the conductive ions are effectively diffused to the substrate to form the conductive segment through the annealing procedure. Further, by avoiding the volatilization of the conductive ions during the annealing procedure, the oxidation adhesion layer and the oxidation layer are provided, such that not only operating staff is prevented from inhaling hydrogen arsenide but also the concentration of the adhesion layer is maintained, thereby eliminating the issue of lowered concentration of the conductive ions caused by volatilization.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. An ion implantation method for semiconductor sidewalls, comprising the steps of:

S1: forming at least one trench on a substrate, the at least one trench including an opening, a bottom section far away from the opening, a lower reflecting layer formed on the bottom section, and two sidewalls adjacent to the bottom section;

S2: performing a plasma doping procedure to sputter conductive ions to the lower reflecting layer, and the conductive ions being rebounded from the lower reflecting layer to adhere to the two sidewalls to respectively form an adhesion layer thereon; and S3: performing an annealing procedure to diffuse the conductive ions of the adhesion layer into the substrate to form a conductive segment.

2. The ion implantation method of claim 1, wherein the substrate is formed by sequentially depositing a semiconductor layer and an insulating layer.

3. The ion implantation method of claim 2, wherein the semiconductor layer is made of silicon and the insulating layer is made of silicon nitride.

4. The ion implantation method of claim 1, wherein the trench is formed at a depth greater than ten times of a width of the trench.

5. The ion implantation method of claim 1, after the Step S1, further comprising the steps of:
 S1A: forming at least one protection layer on surfaces of the substrate and the at least one trench; and
 S1B: forming the lower reflecting layer at the bottom section of the at least one trench, and forming two doping sidewalls at positions where the two sidewalls are adjacent to the lower reflecting layer.

6. The ion implantation method of claim 5, wherein in the Step S1A, an oxidation protection layer and a silicon nitride protection layer are sequentially deposited on the surfaces of the substrate and the at least one trench to form the protection layer.

7. The ion implantation method of claim 5, wherein in the Step S2, the conductive ions are deposited in coordination with an inert gas, and the inert gas impacts the conductive ions deposited on the lower reflecting layer to allow the conductive ions to be rebounded to adhere to one of the two doping sidewalls to form the adhesion layer.

8. The ion implantation method of claim 1, wherein in the Step S2, the conductive ions are made of hydrogen arsenide or hydrogen phosphide.

9. The ion implantation method of claim 7, between the Steps S2 and S3, further comprising the step of:
 S2A: oxidizing a surface of the adhesion layer to form an oxidation adhesion layer.

10. The ion implantation method of claim 9, after the Step S3, further comprising the step of:
 S4: removing the oxidation adhesion layer by etching.

11. The ion implantation method of claim 7, between the Step S2 and S3, further comprising the step of:
 S2B: depositing an oxidation layer on the surface of the adhesion layer.

12. The ion implantation method of claim 11, after the Step S3, further comprising the step of:
 S4: removing the oxidation layer by etching.

13. The ion implantation method of claim 11, wherein the oxidation layer is formed by atomic layer deposition (ALD) or molecular layer deposition (MLD).

14. The ion implantation method of claim 1, wherein in the Step S1, the lower reflecting layer is formed on the bottom section of the at least one trench by a spin-on dielectric (SOD) material.

15. The ion implantation method of claim 1, further comprising a plurality of trenches and a plurality of posts each being disposed between any two of the plurality of trenches, and the conductive segment is formed on one of the plurality of posts.

* * * * *